(12) United States Patent
Moon et al.

(10) Patent No.: US 8,519,068 B2
(45) Date of Patent: Aug. 27, 2013

(54) CONDUCTIVE POLYMER CONTAINING CARBAZOLE, AND ORGANIC PHOTOVOLTAIC DEVICE USING SAME

(75) Inventors: Sang Jin Moon, Daejeon (KR); Won Suk Shin, Seoul (KR); Won Wook So, Daejeon (KR); Hye Young Lee, Jeollabuk-do (KR); Kyu Nam Kim, Seoul (KR); Sung Cheol Yoon, Gyeonggi-do (KR); Chang Jin Lee, Daejeon (KR)

(73) Assignee: Korea Research Institute of Chemical Technology (KR)

( * ) Notice: Subject to any disclaimer, the term of this patent is extended or adjusted under 35 U.S.C. 154(b) by 0 days.

(21) Appl. No.: 13/259,867

(22) PCT Filed: Mar. 31, 2010

(86) PCT No.: PCT/KR2010/001957
§ 371 (c)(1),
(2), (4) Date: Sep. 23, 2011

(87) PCT Pub. No.: WO2010/117158
PCT Pub. Date: Oct. 14, 2010

(65) Prior Publication Data
US 2012/0018715 A1 Jan. 26, 2012

(30) Foreign Application Priority Data
Apr. 8, 2009 (KR) .................. 10-2009-0030134

(51) Int. Cl.
C08G 73/06 (2006.01)
C08G 75/06 (2006.01)
C08F 283/00 (2006.01)
C08G 73/00 (2006.01)
C08G 75/00 (2006.01)
C08L 81/00 (2006.01)

(52) U.S. Cl.
USPC ..... 525/540; 525/535; 525/328.4; 525/328.5; 528/423; 528/373; 528/377; 528/380; 257/40

(58) Field of Classification Search
USPC ............... 528/423, 373, 377, 380; 525/540, 525/535, 328.4, 328.5; 257/40
See application file for complete search history.

(56) References Cited

U.S. PATENT DOCUMENTS
2003/0008172 A1 1/2003 Leclerc et al.
2007/0176163 A1 8/2007 Drolet et al.

FOREIGN PATENT DOCUMENTS
JP 2003-031371 1/2003
KR 10-2008-0062807 7/2008
WO 01-41512 6/2001

OTHER PUBLICATIONS
Karim et al; Novel fluorene—solar cells; Apr. 2008; Royal Society of Chemistry; Chem Abstract 149: 83551.*

(Continued)

Primary Examiner — Duc Truong
(74) Attorney, Agent, or Firm — Levenfeld Pearlstein, LLC

(57) ABSTRACT

The present invention relates to a 2,7-carbazole-containing polymer represented by formula 1 and an organic photovoltaic device comprising the conductive polymer as a photoelectric conversion material. The conductive polymer has high photon absorption efficiency and improved hole mobility and is prepared by introducing a specific amount of a carbazole compound either into a polymer, consisting only of a donor functional group containing one or more aromatic monomers, or into a donor-acceptor type polymer comprising a repeating acceptor group introduced into a donor functional group. The conductive polymer can be used as a photoelectric conversion material for organic thin film transistors (OTFTs) or organic light-emitting diodes (OLEDs). Furthermore, the invention provides an organic photovoltaic device comprising the carbazole-containing conductive polymer as an electron donor, and thus can achieve high photoelectric conversion efficiency in organic thin film solar cells.

11 Claims, 3 Drawing Sheets

(56) References Cited

OTHER PUBLICATIONS

Wang et al; Monomers,—light emitting polymers; Aug. 2006; Du Pont De Nenours and company; Chem Abstract 141: 207660.*
Li et al; Synthesis—light emitting polymers; Apr. 2004; American Chemical Society; Chem Abstract 141: 71948.*

International Search Report for PCT/KR2010/001957, dated Oct. 28, 2010.
Jianhui Hou, et al. Journal of the American Chemical Society, 2008, 130(48), 16144.
Jin Young Kim, et al. Science, 2007, 317, 222.

* cited by examiner

CONDUCTIVE POLYMER CONTAINING CARBAZOLE, AND ORGANIC PHOTOVOLTAIC DEVICE USING SAME

CROSS-REFERENCE TO RELATED APPLICATIONS

This is a National Stage Application of International Patent Application No. PCT/KR2010/001957, filed Mar. 31, 2010, which claims the benefit of and priority to Korean Patent Application No. 10-2009-0030134, filed Apr. 8, 2009, the contents of each of which are incorporated fully by reference herein.

BACKGROUND OF THE INVENTION

1. Field of the Invention

The present invention relates to a 2,7-carbazole-containing conductive polymer represented by formula 1 and an organic photovoltaic device comprising the conductive polymer as a photoelectric conversion material, and more particularly to a conductive polymer having improved hole mobility, prepared by introducing a small amount of carbazole into a polymer comprising one or more aromatic monomers, and to an organic photovoltaic device having improved energy conversion efficiency, which comprises the conductive polymer as a photoelectric conversion material.

2. Description of the Prior Art

Organic thin film solar cells use organic materials as a photoactive layer and have advantages in that they have a thin thickness of several hundred nm or less, use relatively inexpensive materials as the photoactive layer and can be manufactured as flexible devices. Due to such advantages, many studies on the organic thin film solar cells have been conducted.

The photoactive layer is generally made of two materials having different electron affinities, in which one of the photoactive materials is excited by absorption of light to form excitons, and electrons in the lower electron affinity material (donor) move to the higher electron affinity material (acceptor) across the interface between the two materials so that the excitons are separated into holes and electrons. Herein, the distance by which the excitons can move is about 10 nm, even though it varies depending on materials. Thus, if the distance between the position of light absorption and the interface of the two materials having different electron affinities is about 10 nm or less, the separation of excitons into electrons and holes can be achieved with the highest efficiency. For this reason, a bulk heterojunction structure comprising a mixture of donor and acceptor materials is mainly used.

Methods for manufacturing organic solar cells are broadly divided into two methods: a method of manufacturing a thin film by thermally depositing donor and acceptor materials, and a method of manufacturing a thin film using a solution process.

Specifically, in the method employing thermal deposition, both the donor and acceptor materials are monomers, whereas in the method employing the solution process, the donor material is generally a polymer, and the acceptor material is a polymer, a fullerene derivative, a perylene derivative, inorganic quantum dot nanoparticles, or the like. Thus, when the solution process employing polymers is used, large-area devices can be manufactured in an inexpensive manner compared to when monomers are thermally deposited. For this reason, in recent years, studies on the solution process employing polymers have been actively conducted.

Till now, the use of a fullerene derivative as the acceptor material has showed the highest efficiency [*J. Am. Chem. Soc.*, 2008, 130(48), 16144]. In order to increase photoelectric conversion efficiency, tandem-type devices comprising an intermediate electrode sandwiched between two polymers that absorb light in different regions have also been developed [*Science*, 2007, 317, 222].

Organic solar cells should satisfy high photoelectric conversion efficiency. To achieve high photoelectric conversion efficiency, the following requirements should be satisfied. First, a large amount of photons should be absorbed in the light absorption layer. Second, the absorbed and excited excitons should move to the donor/acceptor interface so that they should be effectively separated into holes and electrons. Third, the separated holes and electrons should move to the positive and negative electrodes without loss.

When a fullerene derivative is used as an acceptor material in the bulk heterojuction structure, the separation of the second excitons appears to occur quantitatively. Thus, in order to achieve high photoelectric conversion efficiency in organic thin film solar cells, a polymer that is used as the donor material should satisfy both the property of absorbing a large amount of photons and the ability to move holes.

Accordingly, the present inventors have made extensive efforts to achieve high photoelectric conversion efficiency in an organic thin film solar cell and, as a result, have devised a molecular design of an electron donor using a carbazole group which is frequently used due to high hole mobility in organic light-emitting diodes (OLEDs) and organic thin film transistors (OTFTs), thereby completing the present invention.

SUMMARY OF THE INVENTION

It is an object of the present invention to provide a conductive polymer having enhanced photon absorption ability and hole mobility and the use thereof as a photoelectric conversion material.

Another object of the present invention is to provide an organic photovoltaic device comprising said conductive polymer as an electron donor.

To achieve the above objects, the present invention provides a 2,7-carbazole-containing conductive polymer represented by the following formula 1:

[Formula 1]

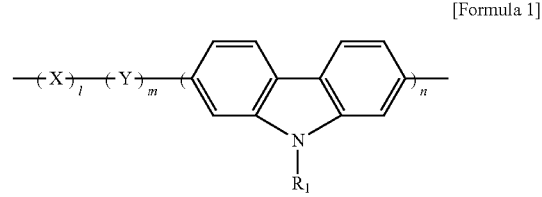

wherein l is the molar fraction of monomer X and is $$0.40 \le \frac{l}{l+m+n} < 1,$$

m is the molar fraction of monomer Y and is $$0 \le \frac{m}{l+m+n} \le 0.50,$$

n is the molar fraction of the carbazole and is $$0 < \frac{n}{l+m+n} \le 0.10,$$

each of X and Y is a monomer structure having a donor, acceptor or light absorption function, and $R_1$ is $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, CN, C(O)R, or C(O)OR, wherein R is $C_1$-$C_{20}$ alkyl, $C_1$-$C_{20}$ heterocycloalkyl, aryl, or heteroaryl.

The content of the carbazole compound in the conductive polymer is preferably $$0 < \frac{n}{l+m+n} \leq 0.10,$$

and more preferably $$0 < \frac{n}{l+m+n} \leq 0.05.$$

Also, when one of X and Y is a donor monomer structure, the other is an acceptor monomer structure.

Also, the present invention provides a photoelectric conversion material for organic photovoltaic devices, organic light-emitting diodes or organic thin film transistors, which comprises the 2,7-carbazole-containing conductive polymer represented by formula 1.

In the photoelectric conversion material, the content of the carbazole compound in the conductive polymer is preferably $$0 < \frac{n}{l+m+n} \leq 0.10,$$

and more preferably $$0 < \frac{n}{l+m+n} \leq 0.05.$$

Furthermore, the present invention provides an organic photovoltaic device comprising a substrate, a first electrode, a buffer layer, a photoelectric conversion layer and a second electrode, wherein the photoelectric conversion layer is made of a photoelectric conversion material which is a mixture of the inventive 2,7-carbazole-containing conductive polymer of formula 1 as an electron donor and a $C_{60}$ fullerene derivative or a $C_{70}$ fullerene derivative as an electron acceptor.

In the organic photovoltaic device, the content of the carbazole compound in the conductive polymer is preferably $$0 < \frac{n}{l+m+n} \leq 0.10,$$

and more preferably $$0 < \frac{n}{l+m+n} \leq 0.05.$$

In the organic photovoltaic device of the present invention, the photoelectric conversion layer is made of a photoelectric conversion material which is a mixture of the 2,7-carbazole-containing conductive polymer of formula 1 as an electron donor and a $C_{60}$ fullerene derivative or a $C_{70}$ fullerene derivative as an electron acceptor, in which the electron donor and the electron acceptor are mixed with each other at a weight ratio of 1:0.5-1:4.

Also, the photoelectric conversion material is prepared as a solution by dissolving it in any one solvent selected from the group consisting of chlorobenzene, 1,2-dichlorobenzene and chloroform to reach a solid content of 1.0-3.0 wt %.

According to the present invention, a conductive polymer having high photon absorption efficiency and enhanced hole motility can be provided by introducing a small amount of carbazole into a polymer containing one or more aromatic monomers.

Due to its high photon absorption efficiency and hole mobility, the carbazole-containing conductive polymer can be used as an electron donor in an organic photovoltaic device. Also, it can be advantageously used in various fields, including organic thin film transistors (OTFTs) and organic light-emitting diodes (OLEDs).

In addition, according to the present invention, an organic photovoltaic device constituting a photoelectric conversion layer can be provided by using the carbazole-containing conductive polymer as an electron donor and a $C_{60}$ fullerene derivative or a $C_{70}$ fullerene derivative as an electron acceptor.

BRIEF DESCRIPTION OF THE DRAWINGS

The above and other objects, features and advantages of the present invention will be more clearly understood from the following detailed description taken in conjunction with the accompanying drawing, in which.

DETAILED DESCRIPTION OF THE INVENTION

Figure 1:
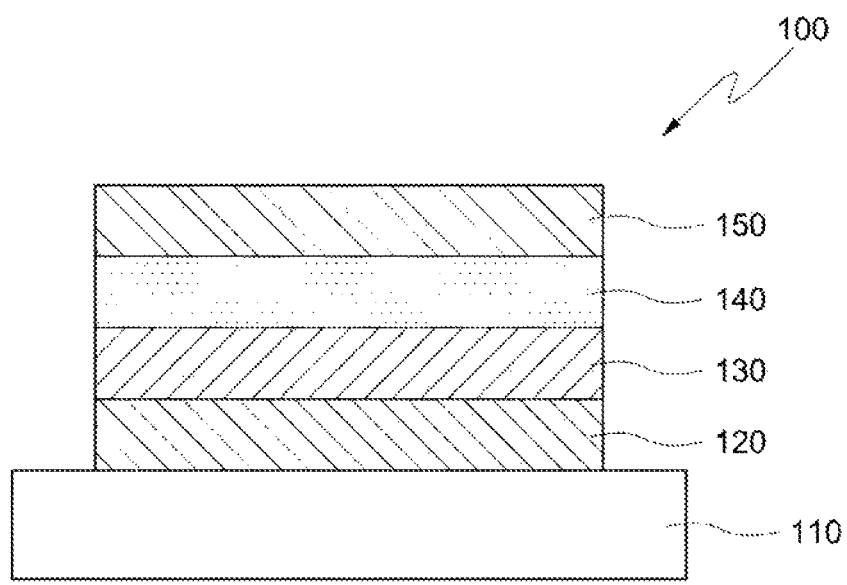
FIG. 1 is a schematic view of an organic photovoltaic device manufactured according to an embodiment of the present invention.

Hereinafter, the present invention will be described in detail.

The present invention provides a 2,7-carbazole-containing conductive polymer represented by the following formula 1:

[Formula 1]

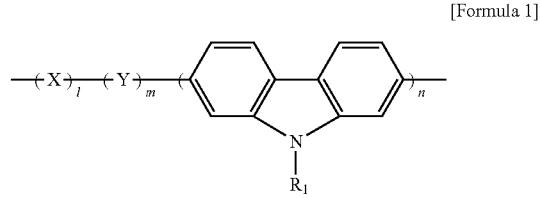

wherein l is the molar fraction of monomer X and is $$0.40 \leq \frac{l}{l+m+n} < 1,$$

m is the molar fraction of monomer Y and is $$0 \leq \frac{m}{l+m+n} \leq 0.50,$$

n is the molar fraction of the carbazole and is $$0 < \frac{n}{l+m+n} \leq 0.10,$$

each of X and Y is a monomer structure having a donor, acceptor or light absorption function, and $R_1$ is $C_1$-$C_{20}$ alkyl, $C_1$-$C_{20}$ alkoxy, $C_3$-$C_{20}$ cycloalkyl, $C_1$-$C_{20}$ heterocycloalkyl, aryl, heteroaryl, CN, C(O)R, or C(O)OR, wherein R is $C_1$-$C_{20}$ alkyl, $C_1$-$C_{20}$ heterocycloalkyl, aryl, or heteroaryl.

The conductive polymer of formula 1 comprises a carbazole group of high hole mobility introduced either into a polymer, consisting only of a donor functional group and comprising one or more aromatic monomers, or into a donor-acceptor type polymer comprising a repeating acceptor group introduced into a donor functional groups. If the content of the 2,7-carbazole group in the conductive polymer is excessively high, it will be difficult to achieve the high absorbance of the conductive polymer that is the desired compound, due to the relatively low absorbance of the carbazole group. Thus, the carbazole group is introduced into the inventive conductive polymer of formula 1, whereby a conductive polymer can be obtained, which can improve hole mobility and, at the same time, can achieve high absorbance.

Accordingly, the content of the carbazole compound in the conductive polymer of formula 1 according to the present invention is preferably $$0 < \frac{n}{l+m+n} \leq 0.10,$$

and more preferably $$0 < \frac{n}{l+m+n} \leq 0.05.$$

If the content of the carbazole compound is more than 0.1, the conductive polymer will have insufficient absorbance such that it cannot be used as a photoelectric conversion material, and the energy conversion efficiency thereof will be reduced.

Also, in order to introduce both the function of increasing absorbance and the function of achieving the self-assembly of the polymer, X, Y or a combination of X and Y in the conductive polymer of formula 1 according to the present invention 1 is important. When any one of X and Y is a donor monomer structure, the other should have an acceptor monomer structure.

The donor monomer is preferably any one selected from among compounds represented by the following formula 2 to formula 10:

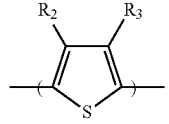
[Formula 2]

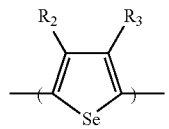
[Formula 3]

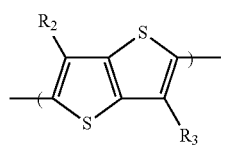
[Formula 4]

[Formula 5]

[Formula 6]

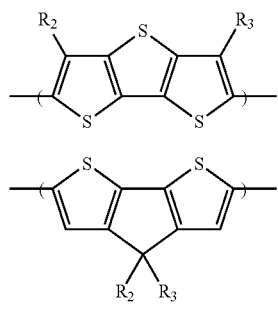

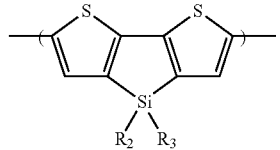
[Formula 7]

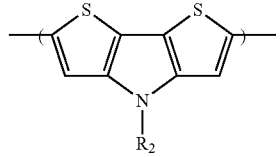
[Formula 8]

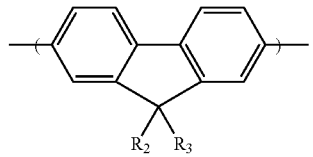
[Formula 9]

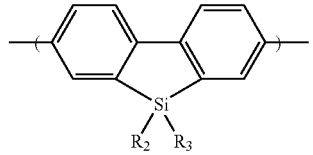
[Formula 10]

wherein $R_2$ or $R_3$ is $C_1$-$C_{20}$ alkyl, $C_1$-$C_{20}$ heterocycloalkyl, aryl, or heteroaryl.

Also, the acceptor monomer is preferably any one selected from among compounds represented by the following formula 11 to 16:

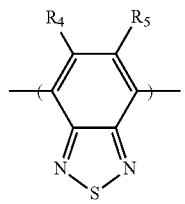
[Formula 11]

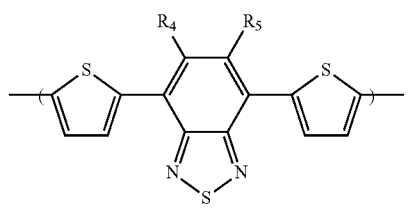
[Formula 12]

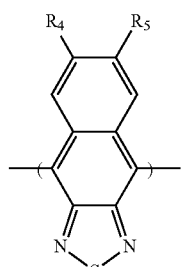
[Formula 13]

-continued

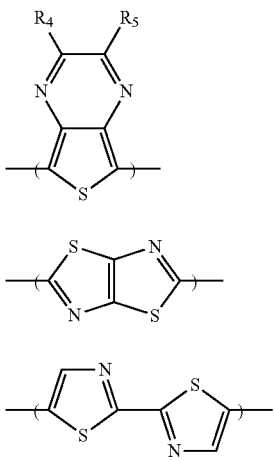

[Formula 14]

[Formula 15]

[Formula 16]

wherein $R_4$ or $R_5$ is $C_1$-$C_{20}$ alkyl, $C_1$-$C_{20}$ heterocycloalkyl, aryl, or heteroaryl.

X or Y in the conductive polymer of formula 1 according to the present invention may be not only the donor monomer or acceptor monomer, but also any one monomer structure selected from among various known conductive functional groups, or monomers having light absorption function. Preferably, both X and Y may be crystalline thiophene derivatives. More preferably, X has a donor functional group, and Y has an acceptor functional group, so that a low-bandgap polymer of donor-acceptor type can be provided.

The present invention provides the use of the 2,7-carbazole-containing conductive polymer of the following formula 1 as a photoelectric conversion material serving as an electron donor in an organic photovoltaic device:

[Formula 1]

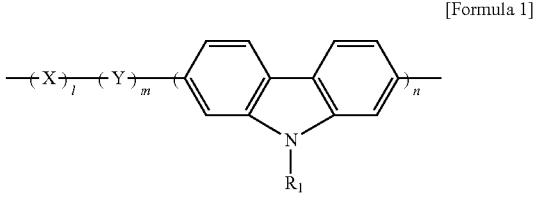

wherein l, m, n, X, Y and $R_1$ are as defined above.

The content of the carbazole compound in the conductive polymer is preferably $$0 < \frac{n}{l+m+n} \leq 0.10,$$

and more preferably $$0 < \frac{n}{l+m+n} \leq 0.05.$$

In an embodiment of the present invention, a preferred conductive polymer containing a carbazole group in a copolymer of fluorene and dithienylbenzothiadiazole is prepared according to the following reaction scheme 1:

[Reaction Scheme 1]

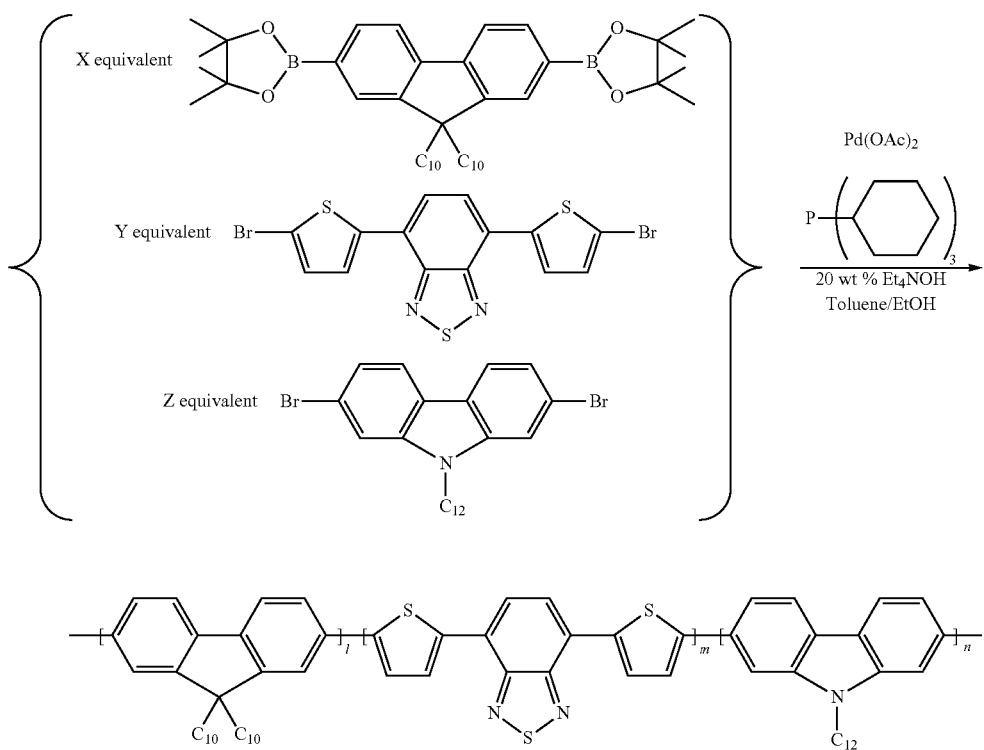

In another embodiment, a conductive polymer containing a carbazole group in a copolymer of dithiophenesilole and benzothiazole is prepared according to the following reaction scheme 2:

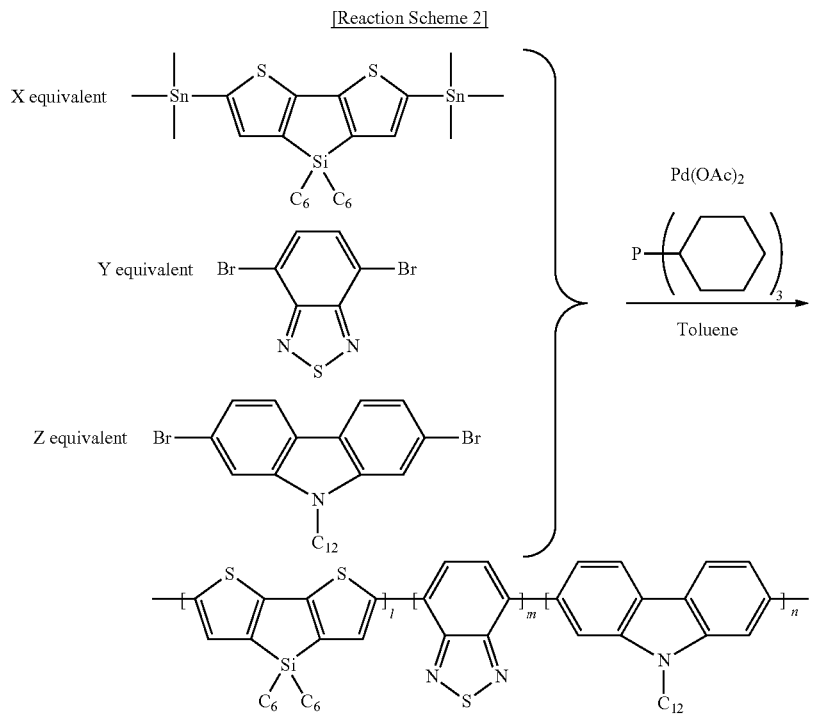

According to the present invention, a conductive polymer having improved hole transfer performance can be prepared by introducing the 2,7-carbazole group into the main chain of the conductive polymer in an amount of 20 mole % or less, and preferably 10 mole % or less.

When the carbazole-containing conductive polymer of the present invention is used as an electron donor and a fullerene derivative is used as an acceptor, the organic thin film solar cell shows high photoelectric conversion efficiency (Tables 1 and 2), thereby satisfying both high photon absorption efficiency and hole mobility.

Accordingly, the present invention provides the use of the 2,7-carbazole-containing conductive polymer of formula 1 as a photoelectric conversion material useful as a nonlinear optical material in organic photovoltaic devices, organic light-emitting diodes (OLEDs) or organic thin film transistors (OTFTs).

The present invention also provides an organic photovoltaic device comprising a substrate, a first electrode, a buffer layer, a photoelectric conversion layer and a second electrode, wherein the photoelectric conversion layer is made of a photoelectric conversion material which is a mixture of the inventive 2,7-carbazole-containing conductive polymer of formula 1 as an electron donor and a $C_{60}$ fullerene derivative or a $C_{70}$ fullerene derivative as an electron acceptor.

FIG. 1 is a schematic view showing an organic photovoltaic device manufactured according to a preferred embodiment of the present invention. As shown in FIG. 1, an organic photovoltaic device 100 according to the present invention comprises, from bottom to top, a substrate 110, a first electrode 120, a buffer layer 130, a photoelectric conversion layer 140 and a second electrode 150, wherein the photoelectric conversion layer is formed of a photoelectric conversion material which is a mixture of the 2,7-carbazole-containing conductive polymer of formula 1 as an electron donor and a $C_{60}$ fullerene derivative or a $C_{70}$ fullerene derivative as an electron acceptor.

Also, in the organic photovoltaic device of the present invention, an electron transfer layer, a hole blocking layer or an optical space layer may be introduced between the photoelectric conversion layer 140 and the second electrode 150.

Figure 2:
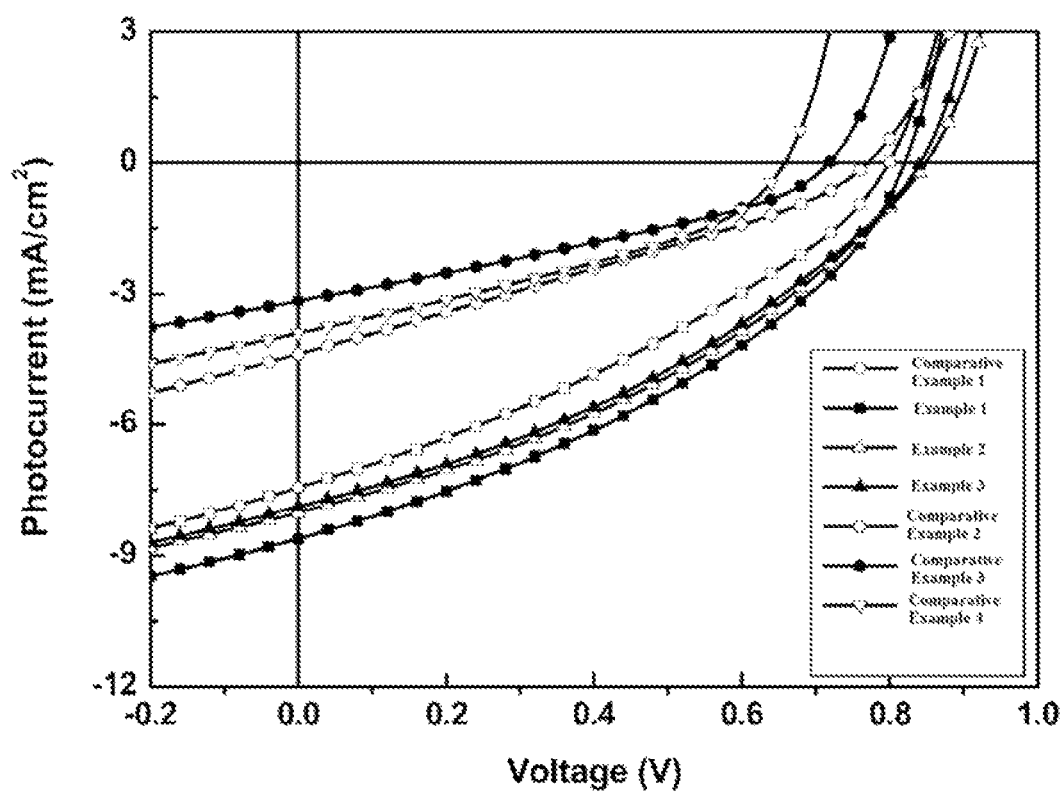
FIG. 2 shows the results of measuring the current density-voltage of organic photovoltaic devices manufactured according to preferred embodiments of the present invention.
Figure 3:
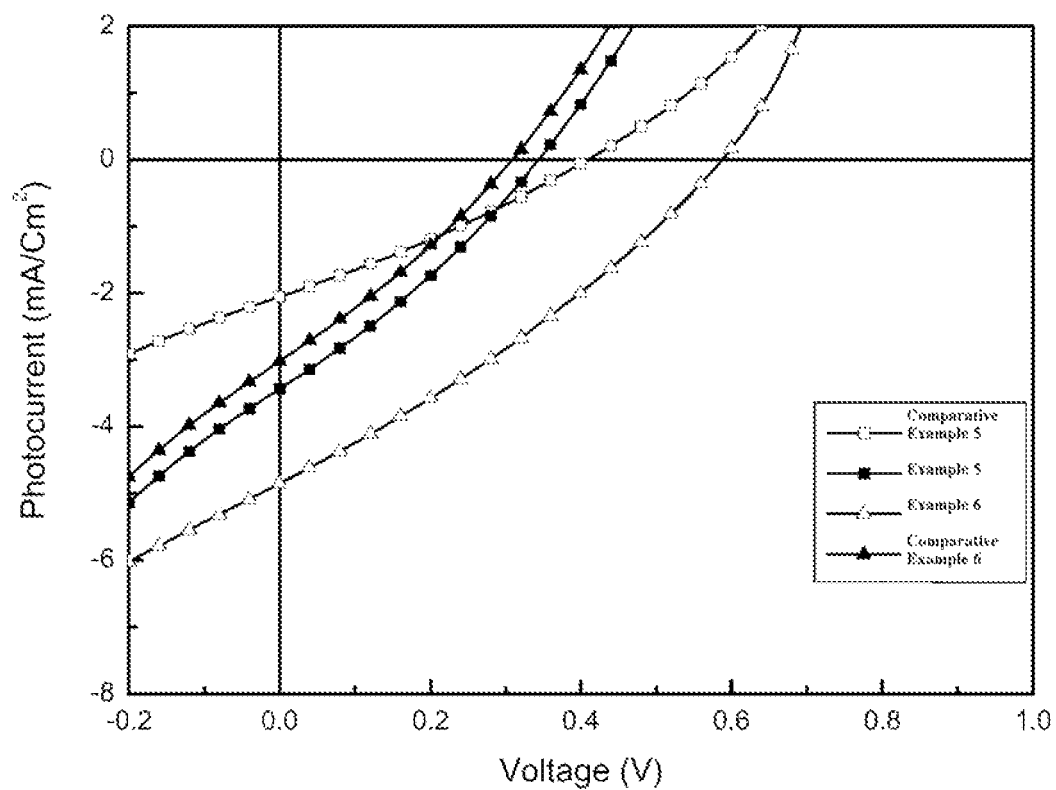
FIG. 3 shows the results of measuring the current density-voltage of organic photovoltaic devices manufactured according to other preferred embodiments of the present invention.

Because the conductive polymer that is used as the electron donor in the organic photovoltaic device of the present invention contains carbazole, the organic photovoltaic device of the present invention may have high photon absorption efficiency and improved hole mobility, thereby achieving high photoelectric conversion efficiency in the organic thin film solar cell (FIGS. 2 and 3).

The content of carbazole in the conductive polymer which is used as the electron donor in the organic photovoltaic device of the present invention is preferably $$0 < \frac{n}{l+m+n} \leq 0.10,$$

and more preferably $$0 < \frac{n}{l+m+n} \leq 0.05.$$

The material of the substrate 110 that is used in the organic photovoltaic device of the present invention is preferably a transparent material, and examples thereof include glass or plastic materials, such as PET (polyethylene terephthalate), PEN (polyethylene naphthelate), PP (polypropylene), PI (polyamide), TAC (triacetyl cellulose) and the like, with the preferred being glass.

The first electrode 120 may be formed by applying a transparent material or a film of transparent material on one surface of the substrate 110 by sputtering, spin coating or the like. The first electrode 120 functions as an anode. As the material of the first electrode 120, any material may be used without particular limitation, as long as it is a transparent conductive material having a work function lower than that of the second electrode 150 as described below. Examples of the material of the first electrode 120 include ITO (indium-tin oxide), FTO (fluorine doped tin oxide), ZnO—($Ga_2O_3$ or $Al_2O_3$), $SnO_2$—$Sb_2O_3$ and the like. More preferably, ITO is used.

The buffer layer 130 which is formed on the first electrode 120 may be made of poly(3,4-ethylenedioxythiophene) doped with polystyrene sulfonate [PEDOT:PSS], which can enhance hole mobility. The buffer layer 130 can be formed by a method such as spin coating.

Meanwhile, on the buffer layer 130, the photoelectric conversion layer 140 is deposited. The photoelectric conversion layer 140 has a junction structure of an electron donor and an electron donor and provides a photovoltaic effect by fast charge transfer between the electron donor and the electron acceptor.

In the present invention, the 2,7-carbazole-containing conductive polymer of formula 1 according to the present invention is used as the electron donor in the photoelectric conversion layer 140, and a $C_{60}$ fullerene derivative or a $C_{70}$ fullerene derivative is used as the electron acceptor.

Also, in the photoelectric conversion material of the photoelectric conversion layer 140 of the present invention, the mixing ratio between the 2,7-carbazole-containing conductive polymer of formula 1 and the $C_{60}$ fullerene derivative or the $C_{70}$ fullerene derivative is preferably a weight ration of 1:0.5-1:4. If the fullerene derivative is used in less than 0.5, the movement of produced electrons will be insufficient due to lack of the content of the crystallized fullerene derivative, and if the fullerene derivative exceeds at a weight ratio of 4, the amount of the conductive polymer that absorbs light will be decreased, so that the efficient absorption of light will not be achieved.

The photoelectric conversion material which consists of the mixture of the carbazole-containing conductive polymer and the $C_{60}$ fullerene derivative or the $C_{70}$ fullerene derivative is dissolved in a single organic solvent or two or more organic solvents having different boiling points to prepare a solution. Specifically, the photoelectric conversion material is dissolved in any one solvent selected from chlorobenzene, 1,2-dichlorobenzene and chloroform so as to reach a solid content of 1.0-3.0 wt %. If the solid content of the solution is less than 1.0 wt %, there will be a problem in maintaining the thickness of the photoelectric conversion layer at 70 nm or more, and if the solid content is more than 3.0 wt %, a significant amount of the conductive polymer and the $C_{70}$ fullerene derivative will not be dissolved.

Then, the solution of the photoelectric conversion material is applied or coated by a method selected from among spin coating, screen printing, inkjet printing, and doctor blade coating, thereby forming the photoelectric conversion layer 140 having a thickness of about 70 nm or more, and preferably 80-200 nm.

The second electrode 150 can be formed on the photoelectric conversion layer 140 by thermally depositing a metal material such as aluminum under a vacuum of about $10^{-7}$ torr or less to a thickness of 100-200 nm.

Examples of a material that can be used to form the second electrode 150 include gold, aluminum, copper, silver, or their alloys, a calcium/aluminum alloy, a magnesium/silver alloy, aluminum/lithium alloy, and the like. Preferably, aluminum or an aluminum/calcium alloy is used.

Hereinafter, the present invention will be described in further detail with reference to examples. It is to be understood, however, that these examples are for illustrative purposes and the scope of the present invention is not limited thereto.

Example 1

Synthesis of Polymer-2

0.300 g (0.429 mmol) of 2,7-bis(4',4',5',5'-tetramethyl-1',3',2'-dioxaborolan-2'-yl)-9,9-didecylfluorene, 0.187 g (0.409 mmol) of 4,7-di-2'-(5'-bromo)-thienyl-2,1,3-benzothiadiazole, and 0.0106 g (0.0215 mmol) of N-dodecyl-2,7-dibromocarbazole were charged into a reaction flask and maintained in a vacuum for 1 hour, after which 7 ml of toluene was added thereto, and the mixture was stirred for 30 minutes. After 1.5 ml of ethanol and 1.5 ml of 20 wt % $Et_4NOH$ have been added thereto, the solution was bubbled with nitrogen to remove oxygen dissolved in the solvent. Then, 2.9 mg (0.0129 mmol) of Pd(OAc)$_2$ and 10.8 mg (0.0386 mmol) of tricyclohexylphosphine were added, and the mixture was refluxed in a nitrogen atmosphere for 2 days while the temperature of the external oil bath was maintained at 120° C. 0.05 g of phenylboronic acid was added thereto and allowed to react for 3 hours, and then 0.12 g of bromobenzene was added and allowed to react for 4 hours. The reaction solution was dropped into 300 ml of methanol, and the resulting crude solid polymer was washed with methanol in a Soxhlet apparatus for 24 hours. The solvent was replaced with chloroform to dissolve the polymer, and then the solvent was evaporated to leave only a minimum amount of the solvent, and the residue was precipitated in 300 ml of methanol. Then, the solid was filtered, after which the solvent was removed, and the residue was dissolved in a minimum amount of chloroform, precipitated again in 300 ml of methanol, filtered, and dried under a vacuum, thereby obtaining 200 mg of a polymer [Mw=5,448 g/mol (PDI=2.0)].

Example 2

Synthesis of Polymer-3

The procedure of Example 1 was repeated, except that 0.300 g (0.429 mmol) of 2,7-bis(4',4',5',5'-tetramethyl-1',3',2'-dioxaborolan-2'-yl)-9,9-didecylfluorene, 0.177 g (0.386 mmol) of 4,7-di-2'-(5'-bromo)-thienyl-2,1,3-benzothiazole, and 0.0212 g (0.0429 mmol) of N-dodecyl-2,7-dibromocarbazole were charged into a reaction flask and maintained in a vacuum for 1 hour, after which 7 ml of toluene was added thereto and the mixture was stirred for 30 minutes, thereby obtaining 200 mg of a polymer [Mw=6,796 g/mol (PDI=2.0)].

Example 3

Synthesis of Polymer-4

The procedure of Example 1 was repeated, except that 0.400 g (0.573 mmol) of 2,7-bis(4',4',5',5'-tetramethyl-1',3',2'-dioxaborolan-2'-yl)-9,9-didecylfluorene, 0.210 g (0.458 mmol) of 4,7-di-2'-(5'-bromo)-thienyl-2,1,3-benzothiazole, and 0.0106 g (0.0215 mmol) of N-dodecyl-2,7-dibromocarbazole were charged into a reaction flask and maintained in a vacuum for 1 hour, after which 8 ml of toluene was added thereto and the mixture was stirred for 30 minutes, thereby obtaining 200 mg of a polymer [Mw=5,125 g/mol (PDI=2.0)].

Comparative Example 1

Synthesis of Polymer-1

The procedure of Example 1 was repeated, except that 0.300 g (0.429 mmol) of 2,7-bis(4',4',5',5'-tetramethyl-1',3',2'-dioxaborolan-2'-yl)-9,9-didecylfluorene, 0.197 g (0.429 mmol) of 4,7-di-2'-(5'-bromo)-thienyl-2,1,3-benzothiazole were charged into a reaction flask and maintained in a vacuum for 1 hour, after which 7 ml of toluene was added thereto and the mixture was stirred for 30 minutes, thereby obtaining 120 mg of a polymer [Mw=5,015 g/mol (PDI=1.8)].

Comparative Example 2

Synthesis of Polymer-5

The procedure of Example 1 was repeated, except that 0.3 g (0.429 mmol) of 2,7-bis(4',4',5',5'-tetramethyl-1',3',2'-dioxaborolan-2'-yl)-9,9-didecylfluorene, 0.137 g (0.300 mmol) of 4,7-di-2'-(5'-bromo)-thienyl-2,1,3-benzothiazole, and 0.064 g (0.129 mmol) of N-dodecyl-2,7-dibromocarbazole were charged into a reaction flask and maintained in a vacuum for 1 hour, after which 7 ml of toluene was added thereto and the mixture was stirred for 30 minutes, thereby obtaining 260 mg of a polymer [Mw=8,521 g/mol (PDI=2.4)].

Comparative Example 3

Synthesis of Polymer-6

The procedure of Example 1 was repeated, except that 0.3 g (0.429 mmol) of 2,7-bis(4',4',5',5'-tetramethyl-1',3',2'-dioxaborolan-2'-yl)-9,9-didecylfluorene, 0.118 g (0.258 mmol) of 4,7-di-2'-(5'-bromo)-thienyl-2,1,3-benzothiazole, and 0.084 g (0.172 mmol) of N-dodecyl-2,7-dibromocarbazole were charged into a reaction flask and maintained in a vacuum for 1 hour, after which 7 ml of toluene was added thereto and the mixture was stirred for 30 minutes, thereby obtaining 220 mg of a polymer [Mw=12,233 g/mol (PDI=2.6)].

Comparative Example 4

Synthesis of Polymer-7

The procedure of Example 1 was repeated, except that 0.3 g (0.429 mmol) of 2,7-bis(4',4',5',5'-tetramethyl-1',3',2'-dioxaborolan-2'-yl)-9,9-didecylfluorene, 0.098 g (0.215 mmol) of 4,7-di-2'-(5'-bromo)-thienyl-2,1,3-benzothiazole, and 0.106 g (0.215 mmol) of N-dodecyl-2,7-dibromocarbazole were charged into a reaction flask and maintained in a vacuum for 1 hour, after which 7 ml of toluene was added thereto and the mixture was stirred for 30 minutes, thereby obtaining 270 mg of a polymer [Mw=9,342 g/mol (PDI=2.4)].

Example 4

Manufacture of Organic Photovoltaic Device 1

Each of the carbazole-containing conductive polymers of Examples 1 to 3 and Comparative Examples 1 to 4, synthesized by the Suzuki's method, was used as an electron donor, and a $C_{70}$-PCBM was used as an electron acceptor. The electron donor and the electron acceptor were mixed with each other at a weight ratio of 1:3 to prepare a photoelectric conversion layer material, which was then dissolved in a chlorobenzene solvent at a content of 1.5 wt %. Then, the solution was spin-coated on an ITO glass substrate having a PEDOT layer formed thereon in an argon atmosphere, thereby forming a photoelectric conversion layer having a thickness of 70-120 nm. Then, the resulting structure was heat-treated on a hot plate at 120° C. for 5 minutes.

Next, in a vacuum chamber having a vacuum degree of $10^{-7}$ torr or less, 0.6 nm of LiF and 100-200 nm of aluminum were sequentially thermally deposited on the photoelectric conversion layer, thereby manufacturing an organic photovoltaic device.

Test Example 1

Electro-Optical Properties of Organic Photovoltaic Device

Each of the polymers of Examples 1 to 3 and Comparative Examples 1 to 4, prepared as shown in the following reaction scheme 1, was mixed with $C_{70}$-PCBM at a weight ratio of 1:3 to prepare a photoelectric conversion layer material, and the electro-optical properties of an organic photovoltaic device comprising the prepared photoelectric conversion layer material were measured. The results of the measurement are shown in Table 1 below.

FIG. 2 is a graphic diagram showing the results of measuring the current density-voltage (J-V) of the organic photovoltaic device comprising the photoelectric conversion layer material prepared by mixing each of the conductive polymers of Examples 1 to 3 and Comparative Examples 1 to 4 with $C_{70}$-PCBM at a weight ratio of 1:3.

Among the electro-optical properties, fill factor and energy conversion efficiency were calculated using the following equations 1 and 2, respectively.

$$\text{Fill factor} = (V_{mp} \times I_{mp})/(V_{oc} \times I_{sc}) \quad \text{[Equation 1]}$$

wherein $V_{mp}$ is the voltage value at the maximum power point, $I_{mp}$ is current density, $V_{oc}$ is open-circuit voltage, and $I_{sc}$ is short-circuit current.

$$\text{Energy conversion efficiency (\%)} = \text{fill factor} \times (J_{sc} \times V_{oc})/100 \quad \text{[Equation 2]}$$

wherein $J_{sc}$ is short-circuit current density, and $V_{oc}$ is open-circuit voltage.

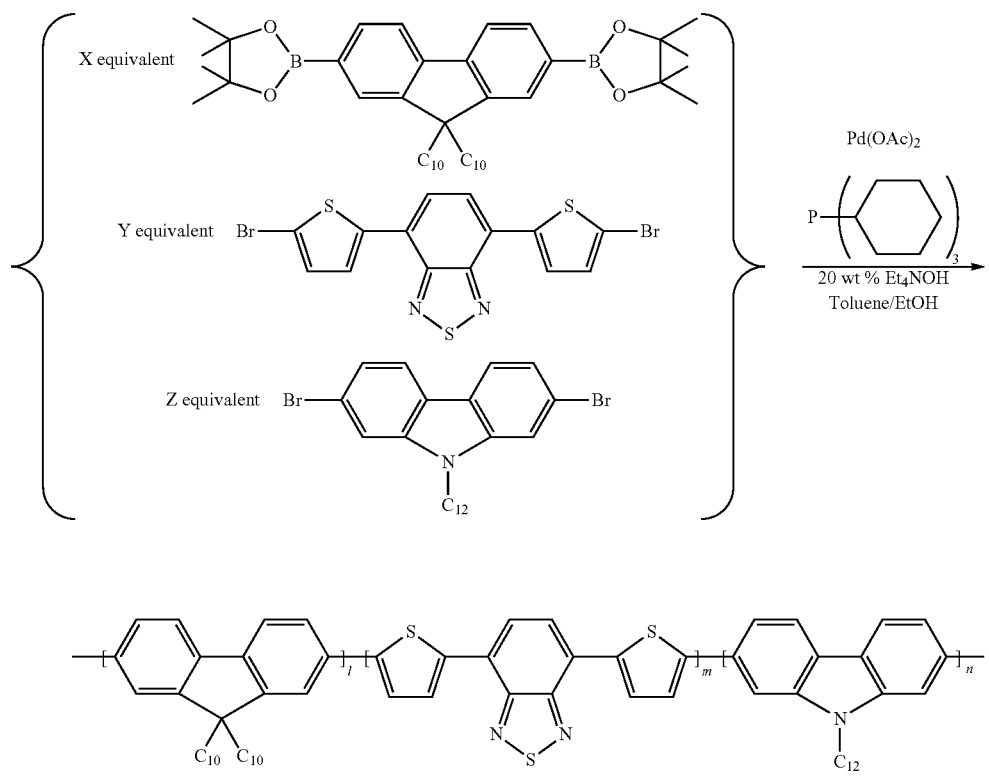

[Reaction Scheme 1]

TABLE 1

Electro-optical properties of organic photovoltaic devices

| | Polymer | Loading ratio (x/y/z) | Addition ratio (l/m/n) | Short-circuit current density ($J_{sc}$) (mA/cm$^2$) | Open-circuit voltage ($V_{oc}$)(V) | Fill factor (FF) | Energy conversion efficiency (%) |
|---|---|---|---|---|---|---|---|
| Comparative Example 1 | Polymer-1 | 1/1/0 | 1/1/0 | 7.44 | 0.80 | 0.33 | 1.99 |
| Example 1 | Polymer-2 | 1/0.95/0.05 | 1/0.97/0.03 | 8.61 | 0.82 | 0.37 | 2.62 |
| Example 2 | Polymer-3 | 1/0.9/0.1 | 1/0.90/0.10 | 8.01 | 0.85 | 0.36 | 2.45 |
| Example 3 | Polymer-4 | 1/0.8/0.2 | 1/0.91/0.09 | 7.88 | 0.84 | 0.36 | 2.37 |
| Comparative Example 2 | Polymer-5 | 1/0.7/0.3 | 1/0.82/0.18 | 4.37 | 0.77 | 0.29 | 0.98 |
| Comparative Example 3 | Polymer-6 | 0/0.6/0.4 | 1/0.60/0.40 | 3.17 | 0.72 | 0.33 | 0.74 |
| Comparative Example 4 | Polymer-7 | 1/0.5/0.5 | 1/0.50/0.50 | 3.90 | 0.66 | 0.36 | 0.93 |

As can be seen from the results in Table 1 and FIG. 1, the polymers of Examples 1 to 3 (polymer-2 to polymer-4), each containing a small amount of carbazole in a copolymer of fluorene and dithienylbenzothiadizole, showed increases in energy conversion efficiency of 31%, 23% and 19%, respectively, compared to the polymer of Comparative Example 1 (polymer-1).

Also, in the case of the polymers of Comparative Examples 2 to 4 (polymer-5 to polymer-7) prepared by adding more than 30 wt % of the monomer to fluorene, the energy conversion efficiency decreased by about 50%, rather than increased.

Example 5

Synthesis of Polymer-9

0.300 g (0.436 mmol) of 2,6-bis(tributylstannanyl)-4,4'-dihexyldithienosilole, 0.122 g (0.414 mmol) of 4,7-bromo-2,1,3-benzothiadiazole, 0.0107 g (0.0218 mmol) of N-dodecyl-2,7-dibromocarbazole and 2 ml of toluene were charged into a reaction flask and bubbled with nitrogen for 10 minutes to remove oxygen dissolved in the solvent. 2.9 mg (0.0129 mmol) of Pd(OAc)$_2$ and 10.8 mg (0.0386 mmol) of tricyclohexylphosphine were added thereto in a nitrogen atmosphere, and the mixture was bubbled again with nitrogen for 5 minutes. Then, the mixture was refluxed for 2 days in a nitrogen atmosphere while the temperature of the external oil bath was maintained at 120☐.

0.05 g of tributylphenyl tin was added thereto and reacted to react for 3 hours, and then 0.12 g of bromobenzene was added and reacted for 4 hours. The reaction solution was dropped into 300 ml of methanol, and the resulting crude solid polymer was washed with methanol in a Soxhlet apparatus for 24 hours. The solvent was replaced with chloroform to dissolve the polymer, and then the solvent was evaporated to leave only a minimum amount of the solvent, and the residue was precipitated in 300 ml of methanol. Then, the solid was filtered, after which the solvent was removed, and the residue was dissolved in a minimum amount of chloroform, precipitated again in 300 ml of methanol, filtered, and dried under a vacuum, thereby obtaining 130 mg of a polymer [Mw=9,764 g/mol (PDI-3.7)].

Example 6

Synthesis of Polymer-10

0.300 g (0.436 mmol) of 2,6-bis(tributylstannanyl)-4,4'-dihexyldithienosilole, 0.102 g (0.349 mmol) of 4,7-bromo-2,1,3-benzothiadiazole, 0.043 g (0.087 mmol) of N-dodecyl-2,7-dibromocarbazole and 1.5 ml of toluene were charged into a reaction flask and bubbled with nitrogen for 10 minutes to remove oxygen dissolved in the solvent.

4.3 mg (0.0190 mmol) of $PC(OAc)_2$ and 15.8 mg (0.0563 mmol) of tricyclohexylphosphine were added thereto in a nitrogen atmosphere, and the mixture was bubbled again with nitrogen for minutes. Then, the mixture was refluxed for 2 days in a nitrogen atmosphere while the temperature of the external oil bath was maintained at 120° C. The subsequent procedures were carried out in the same manner as Example 5, thereby obtaining 180 mg of a polymer [Mw=6,583 g/mol (PDI=3.8)].

Comparative Example 5

Synthesis of Polymer-8

0.40 g (0.58 mmol) of 2,6-bis(tributylstannanyl)-4,4'-dihexyldithienosilole, 0.17 g (0.58 mmol) of 4,7-bromo-2,1,3-benzothiadiazole and 2 ml of toluene were charged into a reaction flask and bubbled with nitrogen for 10 minutes to remove oxygen dissolved in the solvent.

4.0 mg (0.017 mmol) of $Pd(OAc)_2$ and 15.0 mg (0.052 mmol) of tricyclohexylphosphine were added thereto in a nitrogen atmosphere, and the mixture was bubbled again with nitrogen for 5 minutes. Then, the mixture was refluxed for 2 days in a nitrogen atmosphere while the temperature of the external oil bath was maintained at 120° C. The subsequent procedures were carried out in the same manner as Example 5, thereby obtaining 200 mg of a polymer [Mw=8,452 g/mol (PDI=3.1)].

Comparative Example 6

Synthesis of Polymer-11

0.300 g (0.436 mmol) of 2,6-bis(tributylstannanyl)-4,4'-dihexyldithienosilole, 0.064 g (0.218 mmol) of 4,7-bromo-2,1,3-benzothiadiazole, 0.107 g (0.218 mmol) of N-dodecyl-2,7-dibromocarbazole and 1.5 ml of toluene were charged into a reaction flask and bubbled with nitrogen for 10 minutes to remove oxygen dissolved in the solvent. 2.0 mg (0.013 mmol) of $Pd(OAc)_2$ and 11.0 mg (0.039 mmol) of tricyclohexylphosphine were added thereto in a nitrogen atmosphere, and the mixture was bubbled again with nitrogen for 5 minutes. Then, the mixture was refluxed for 2 days in a nitrogen atmosphere while the temperature of the external oil bath was maintained at 120° C. The subsequent procedures were carried out in the same manner as Example 5, thereby obtaining 150 mg of a polymer [Mw=11,154 g/mol (PDI=3.8)].

Example 7

Manufacture of Organic Photovoltaic Device 2

Each of the carbazole-containing conductive polymers of Examples 5 an 6 and Comparative Examples 5 and 6, synthesized by the Stille's method, was used as an electron donor, and $C_{70}$-PCBM was used as an electron acceptor. The electron donor and the electron acceptor were mixed with each other at a weight ratio of 1:3 to prepare a photoelectric conversion layer material, which was then dissolved in a chlorobenzene solvent at a content of 1.5 wt %. Then, using the solution, an organic photovoltaic device was manufactured in the same manner as Example 4.

Test Example 2

Electro-Optical Properties of Organic Photovoltaic Device

Each of the polymers of Examples 5 and 6 and Comparative Examples 5 and 6, prepared as shown in the following reaction scheme 2, was mixed with $C_{70}$-PCBM at a weight ratio of 1:3 to prepare a photoelectric conversion layer material, and the electro-optical properties of an organic photovoltaic device comprising the prepared photoelectric conversion layer material were measured. The results of the measurement are shown in Table 2 below.

FIG. 3 is a graphic diagram showing the results of measuring the current density-voltage (J-V) of the organic photovoltaic device comprising the photoelectric conversion layer material prepared by mixing each of the conductive polymers of Examples 5 and 6 and Comparative Examples 5 and 6 with $C_{70}$-PCBM at a weight ratio of 1:3.

[Reaction Scheme 2]

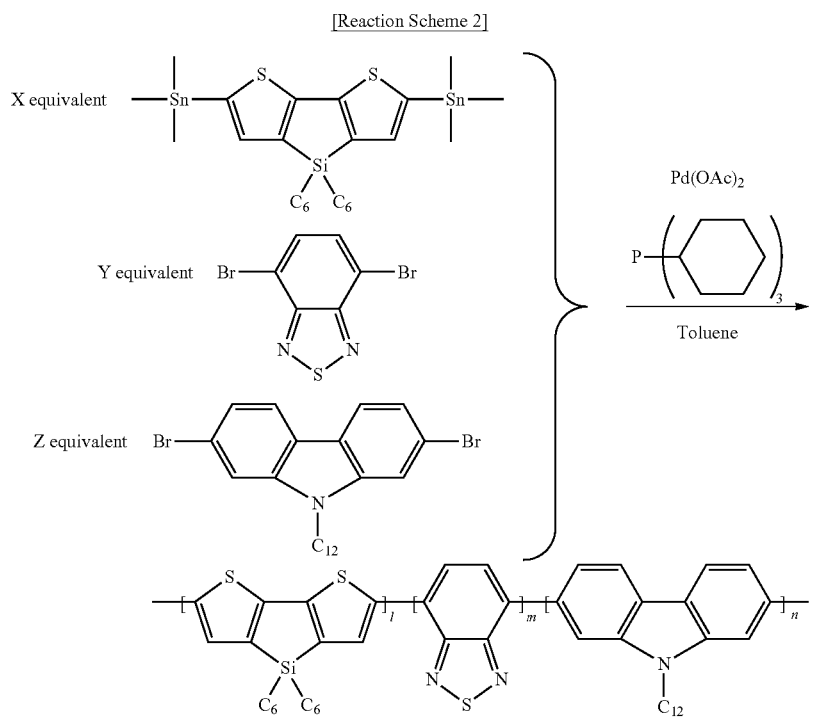

TABLE 2

Electro-optical properties of organic photovoltaic devices

| | Polymer | Loading ratio (x/y/z) | Addition ratio (l/m/n) | Short-circuit current density ($J_{sc}$) (mA/cm$^2$) | Open-circuit voltage ($V_{oc}$)(V) | Fill factor (FF) | Energy conversion efficiency (%) |
|---|---|---|---|---|---|---|---|
| Comparative Example 5 | Polymer-8 | 1/1/0 | 1/1/0 | 2.05 | 0.41 | 0.29 | 0.24 |
| Example 5 | Polymer-9 | 1/0.95/0.05 | 1/0.99/0.01 | 3.44 | 0.34 | 0.30 | 0.35 |
| Example 6 | Polymer-10 | 1/0.8/0.2 | 1/0.91/0.09 | 4.85 | 0.59 | 0.30 | 0.86 |
| Comparative Example 6 | Polymer-11 | 1/0.5/0.5 | 1/0.055/0.45 | 3.02 | 0.31 | 0.29 | 0.27 |

As can be seen from the results in Table 2 above and FIG. 3, the polymers of Examples 5 and 6 (polymer-9 and polymer-10), each containing a small amount of carbazole in a copolymer of dithiophenesilole and benzothiadizole, showed increases in energy conversion efficiency of 46% and 258%, respectively, compared to the polymer of Comparative Example 5 (polymer-8) containing no carbazole.

Also, in the case of the polymer of Comparative Example 6 (polymer-11) containing an increased amount of carbazole, the energy conversion efficiency decreased rather than increased.

As described above, the present invention provides the conductive polymer comprising a specific amount of carbazole introduced either into a polymer, consisting only of a donor functional group containing one or more aromatic monomers, or into a donor-acceptor type polymer comprising a repeating acceptor group introduced into a donor functional group. The conductive polymer has increased charge transfer rate, and thus when it is used as an electron donor in an organic thin film solar cells, it can improve the energy conversion efficiency of the organic thin film solar cell.

Furthermore, the carbazole-containing conductive polymer of the present invention can be used as an electron donor in an organic photovoltaic device and can also be advantageously used in various fields, including organic thin film transistors (OTFTs) and organic light-emitting diodes (OLED).

In addition, the present invention provides the organic photovoltaic device comprising the carbazole-containing conductive polymer as an electron donor, and thus can achieve high photoelectric conversion efficiency in the organic thin film solar cell.

Although the preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:
1. A 2,7-carbazole-containing conductive polymer represented by the following formula 1:

[Formula 1]

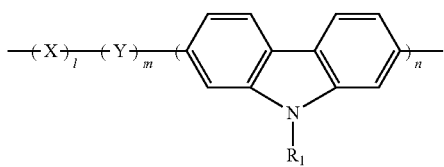

wherein l is the molar fraction of monomer X and is $$0.41 \le \frac{l}{l+m+n} < 1,$$

m is the molar fraction of monomer Y and is $$0 < \frac{m}{l+m+n} \le 0.50,$$

n is the molar fraction of the carbazole and is $$0 < \frac{n}{l+m+n} \le 0.09,$$

each of X and Y is a monomer structure having a donor, acceptor or light absorption function, and $R_1$ is $C_1$-$C_{20}$alkyl, $C_1$-$C_{20}$alkoxy, $C_3$-$C_{20}$ cycloalkyl, $C_1$-$C_{20}$heterocycloalkyl, aryl, heteroaryl, CN, C(O)R, or C(O)OR, wherein R is $C_1$-$C_{20}$alkyl, $C_1$-$C_{20}$heterocycloalkyl, aryl, or heteroaryl.

2. The carbazole-containing conductive polymer of claim 1, wherein n is $$0 < \frac{n}{l+m+n} \le 0.05.$$

3. The carbazole-containing conductive polymer of claim 1, wherein one of X and Y is a donor monomer structure, and the other is an acceptor monomer structure.

4. The carbazole-containing conductive polymer of claim 3, wherein the donor monomer is any one selected from among compounds represented by the following formula 2 to formula 10:

[Formula 2]

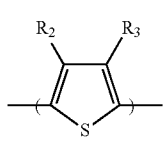

[Formula 3]

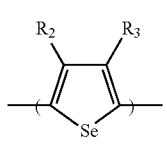

[Formula 4]

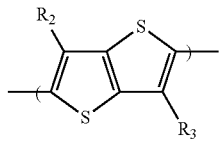

[Formula 5]

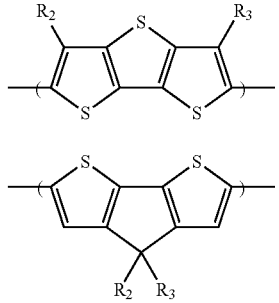

[Formula 6]

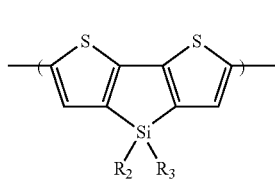

[Formula 7]

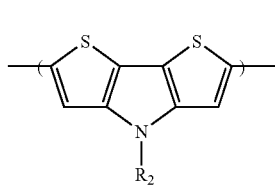

[Formula 8]

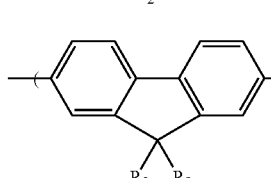

[Formula 9]

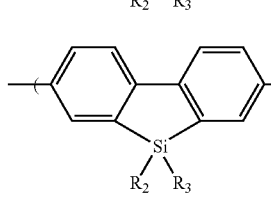

[Formula 10]

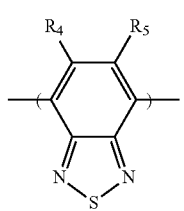

wherein $R_2$ or $R_3$ is $C_1$-$C_{20}$ alkyl, $C_1$-$C_{20}$ heterocycloalkyl, aryl, or heteroaryl.

5. The carbazole-containing conductive polymer of claim 3, wherein the acceptor monomer is any one selected from among compounds represented by the following formula 11 to formula 16:

[Formula 11]

[Formula 12]

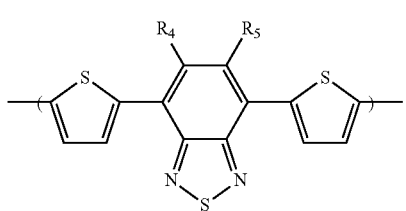

[Formula 13]

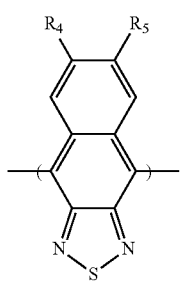

[Formula 14]

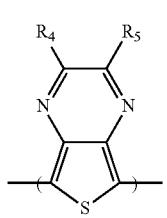

[Formula 15]

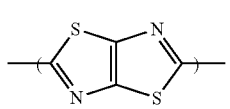

[Formula 16]

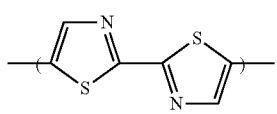

wherein $R_4$ or $R_5$ is $C_1$-$C_{20}$ alkyl, $C_1$-$C_{20}$ heterocycloalkyl, aryl, or heteroaryl.

6. A photoelectric conversion material for organic photovoltaic devices, organic light-emitting diodes or organic thin film transistors, which comprises the 2,7-carbazole-containing conductive polymer represented by formula 1 according to claim 1:

[Formula 1]

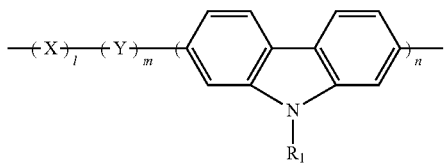

wherein l, m, n, X, Y and $R_1$ are as defined in claim 1.

7. The photoelectric conversion material of claim 6, wherein n is $$0 < \frac{n}{l+m+n} \leq 0.05.$$

8. An organic photovoltaic device comprising a substrate, a first electrode, a buffer layer, a photoelectric conversion layer and a second electrode, wherein the photoelectric conversion layer is made of a photoelectric conversion material which is a mixture of the 2,7-carbazole-containing conductive polymer represented by formula 1 according to claim 1 as an electron donor and a $C_{60}$ fullerene derivative or a $C_{70}$ fullerene derivative as an electron acceptor:

[Formula 1]

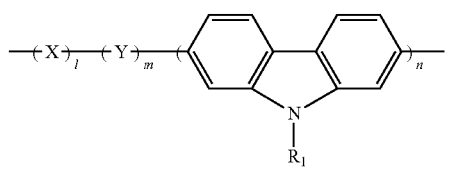

wherein l, m, n, X, Y and $R_1$ are as defined in claim 1.

9. The organic photovoltaic device of claim 8, wherein n is $$0 < \frac{n}{l+m+n} \leq 0.05.$$

10. The organic photovoltaic device of claim 8, wherein the photoelectric conversion layer is made of a photoelectric conversion material which is a mixture of the 2,7-carbazole-containing conductive polymer of formula 1 as the electron donor and the $C_{60}$ fullerene derivative or the $C_{70}$ fullerene derivative as the electron acceptor, in which the electron donor and the electron acceptor are mixed with each other at a weight ratio of 1:0.5-1:4.

11. The organic photovoltaic device of claim 8, wherein the photoelectric conversion material is prepared as a solution by dissolving it in any one solvent selected from the group consisting of chlorobenzene, 1,2-dichlorobenzene and chloroform to reach a solid content of 1.0-3.0 wt %.

* * * * *